(12) United States Patent
Lee

(10) Patent No.: US 6,707,669 B2
(45) Date of Patent: Mar. 16, 2004

(54) HEAT DISSIPATION APPARATUS

(75) Inventor: Jen-Hsiang Lee, Taipei (TW)

(73) Assignee: Quanta Computer, Inc., Taoyuan (TW)

( * ) Notice: Subject to any disclaimer, the term of this patent is extended or adjusted under 35 U.S.C. 154(b) by 0 days.

(21) Appl. No.: 10/252,201

(22) Filed: Sep. 23, 2002

(65) Prior Publication Data

US 2004/0004815 A1 Jan. 8, 2004

(30) Foreign Application Priority Data

Jul. 5, 2002 (TW) ...................................... 91210263 U

(51) Int. Cl.$^7$ ................................................. H05H 7/20
(52) U.S. Cl. ..................... 361/688; 165/80.3; 165/121; 165/185; 62/259.2; 361/690; 361/694; 361/695; 361/697; 415/177; 415/178; 454/184
(58) Field of Search ................................ 165/80.3, 121, 165/185; 62/259.2; 361/688, 690–697; 415/177–178; 454/184

(56) References Cited

U.S. PATENT DOCUMENTS

| | | | | |
|---|---|---|---|---|
| 5,544,488 A | | 8/1996 | Reid | 62/3.7 |
| 5,726,874 A | * | 3/1998 | Liang | 363/141 |
| 5,816,909 A | * | 10/1998 | Wunder | 454/341 |
| 6,088,224 A | * | 7/2000 | Gallagher et al. | 361/695 |
| 6,215,659 B1 | * | 4/2001 | Chen | 361/695 |
| 6,227,961 B1 | * | 5/2001 | Moore et al. | 454/229 |
| 6,554,697 B1 | * | 4/2003 | Koplin | 454/184 |

* cited by examiner

Primary Examiner—Gregory D Thompson

(57) ABSTRACT

A heat dissipation apparatus for a computer system having a heat source. The heat dissipation apparatus includes an outlet, a temperature gradient maintaining device and an unpowered fan. The outlet is disposed on one side of the computer system. A thermal convection route exists between the heat source and the outlet. The temperature gradient maintaining device provides and maintains a temperature difference between the heat source and the outlet. The unpowered fan has a plurality of blades and is disposed on the thermal convection route.

12 Claims, 5 Drawing Sheets

HEAT DISSIPATION APPARATUS

BACKGROUND OF THE INVENTION

1. Field of the Invention

The present invention relates to a heat dissipation apparatus, and in particular to a heat dissipation apparatus having an unpowered fan.

2. Description of the Related Art

Generally speaking, conventional heat dissipation technique for a computer focuses on life span extension of computer components and enhancing efficiency of the heat dissipation device in the computer. The lifespan extension of the heat dissipation device is usually ignored. When the conventional heat dissipation device malfunctions, heat generated by the computer components cannot be dissipated and creates a high temperature on the computer components. Thus, the computer components are easily damaged due to the high temperature, even though the lifespan of the computer component may be far from over.

The conventional heat dissipation device requires electric power to be actuated. For the heat dissipation efficiency to be enhanced, the rotation of the motor is increased. When the motor rotates at a high speed over a long period of time, the lifespan of the motor is reduced due to friction or wear among the body and inner elements thereof. In addition, the heat generated by the computer components increases tremendously when the rotation of the motor increases. Thus, heat dissipation efficiency is reduced. Even though the computer components may continuously function, computer damage resulting from insufficient heat dissipation may be caused and the lifespan of the computer is thus reduced. Accordingly, cooling is critical in maximizing the lifespan of the computer system.

FIG. 1 is a perspective assembly view showing a conventional cooling fan 5 for a CPU 3 and FIG. 2 is a perspective exploded view according to FIG. 1. The fan 5 is disposed on the CPU 3 and a heat sink 4 by engaging portions 51 and engaging elements 21. The fan 5 provides airflow to the heat sink 4 to dissipate the heat generated by the CPU 3. Nevertheless, in the computer system, heat is continuously produced and cannot be dissipated efficiently, such that the temperature of the computer system increases quickly. According to the theory of temperature gradient of thermal dynamics, heat dissipation efficiency is reduced because the temperature gradient in the computer system is increasingly reduced as the computer system is working for a period of time. Even if the rotation of the fan 5 is increased or the structure of the fins 44 of the heat sink 4 is improved, the temperature gradient is not increased. As well, the increased rotation of the fan 5 reduces lifespan thereof. Finally, the failure of the fan 5 can cause computer system damage.

Consequently, the invention provides a heat dissipation apparatus to overcome the aforementioned problems. The heat dissipation apparatus includes an unpowered fan to dissipate the heat generated by the computer components. Since the unpowered fan is not driven by a motor, the lifespan of the unpowered fan is prolonged tremendously. Specifically, the unpowered fan is driven by thermal convection between a heat source having a high temperature and an outlet having a low temperature. Thus, air in the computer system is intensely stirred. The heat or hot air does not accumulate on the heat source and is guided out via the outlet rapidly and evenly by the unpowered fan. Additionally, the heat dissipation apparatus includes a temperature gradient maintaining device disposed on the outlet of the computer system. The temperature gradient is not increasingly reduced as the computer system works for a long period, thus enhancing the heat dissipation efficiency thereof.

SUMMARY OF THE INVENTION

An object of the invention is to provide a heat dissipation apparatus for a computer system. The computer system has a heat source. The heat dissipation apparatus comprises an outlet, a temperature gradient maintaining device and an unpowered fan. The outlet is disposed on one side of the computer system. A thermal convection route exists between the heat source and the outlet. The temperature gradient maintaining device provides and maintains a temperature difference between the heat source and the outlet. The unpowered fan has a plurality of blades and is disposed on the thermal convection route.

Preferably, the unpowered fan is disposed beside the heat source.

Preferably, the temperature gradient maintaining device is disposed on the outlet.

Preferably, the temperature gradient maintaining device maintains the temperature difference between the heat source and the outlet at 30° C.~50° C. to keep the unpowered fan rotating continuously.

Preferably, the blades of the unpowered fan are plastic.

Preferably, the temperature gradient maintaining device is a cooling device.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
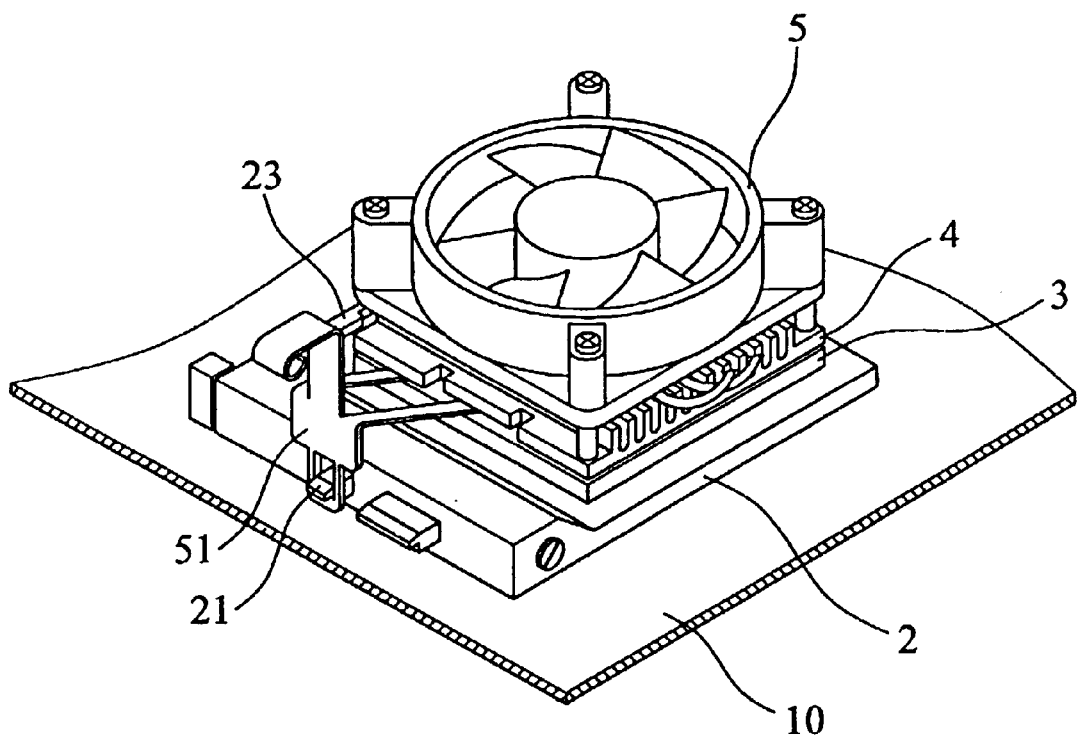
FIG. 1 is a perspective assembly view showing a conventional cooling fan for a CPU.
Figure 2:
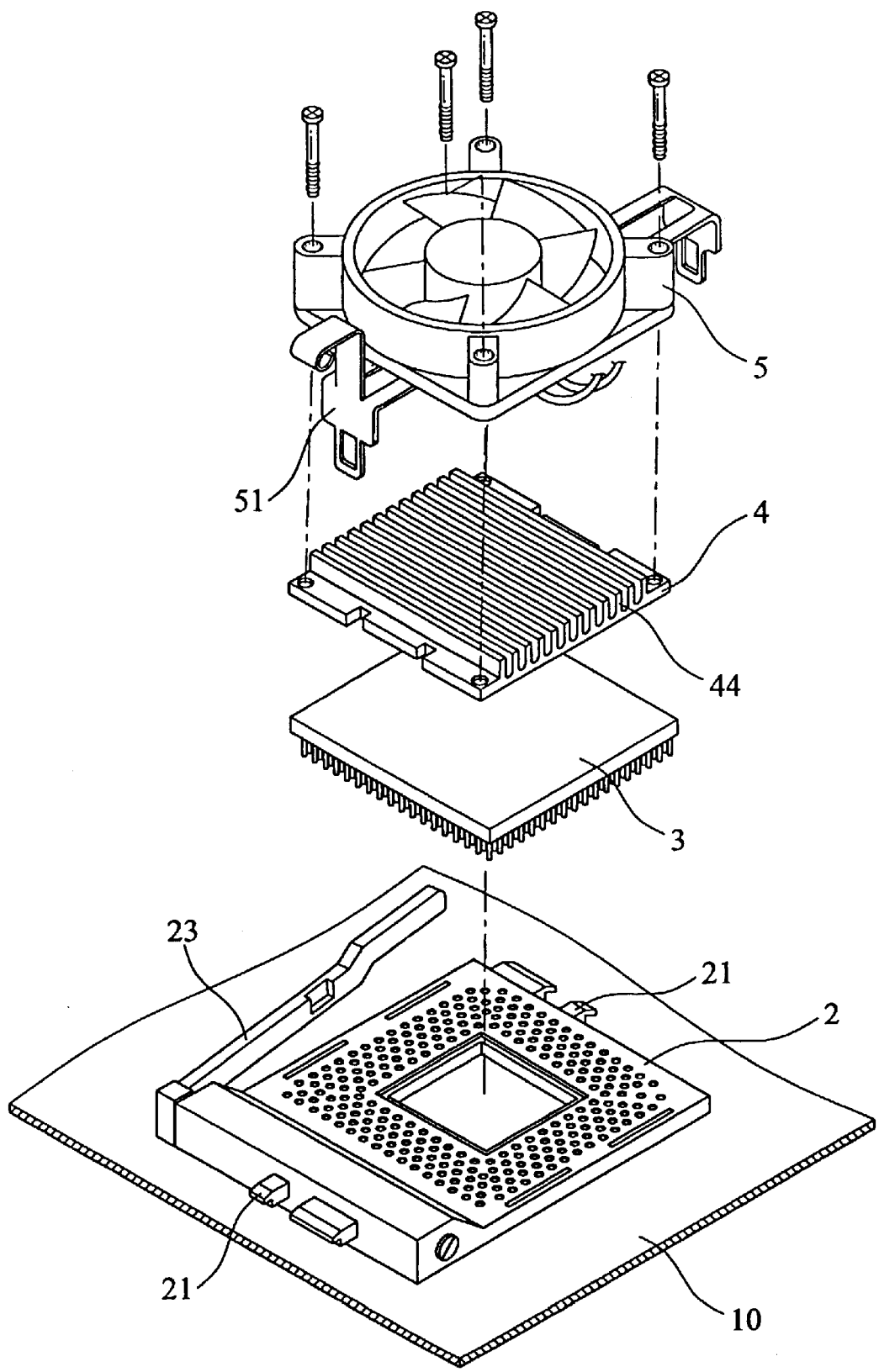
FIG. 2 is a perspective exploded view according to FIG. 1.
Figure 3:
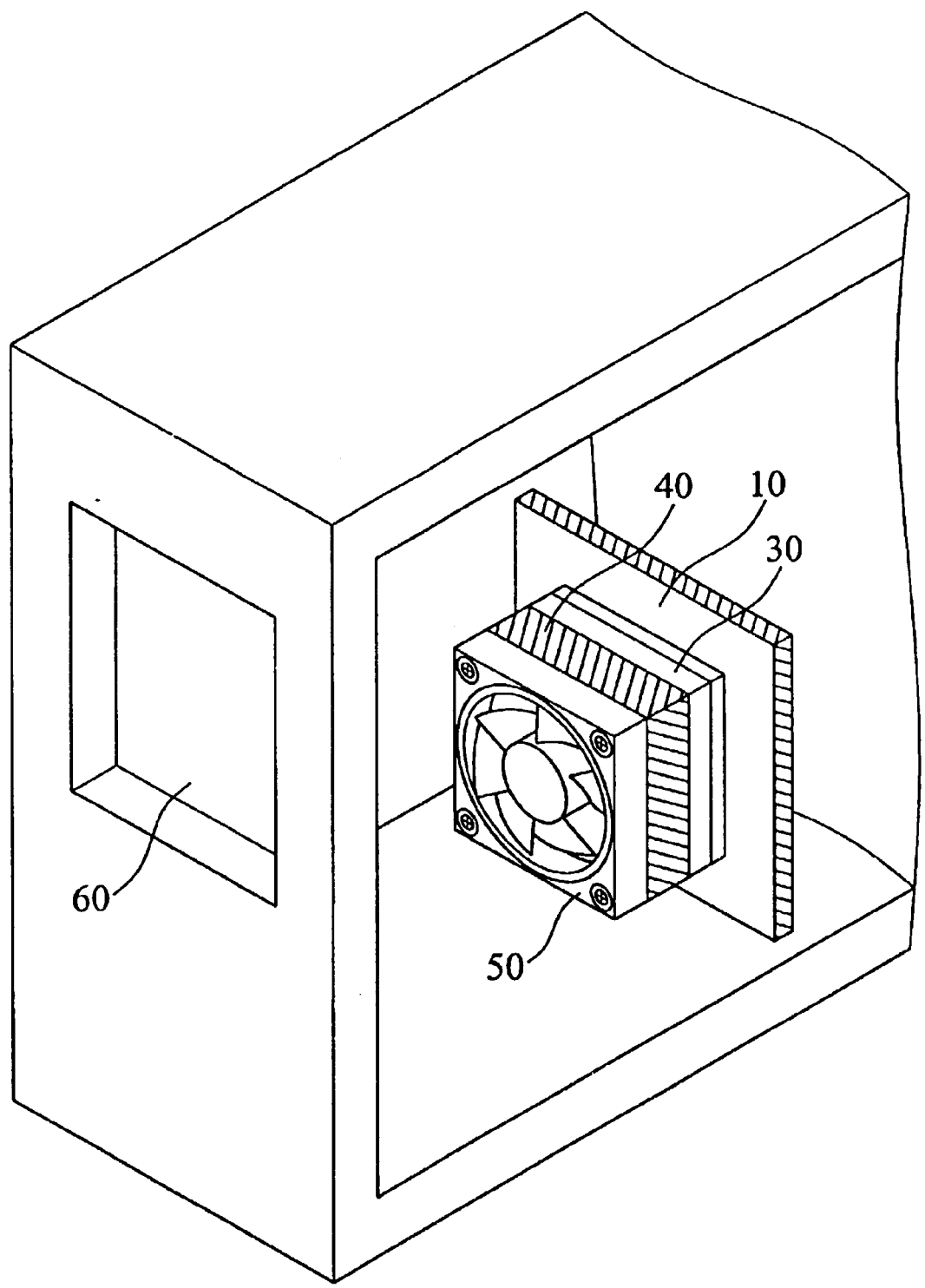
FIG. 3 is a perspective assembly view showing the present heat dissipation apparatus using an unpowered fan.
Figure 4A:
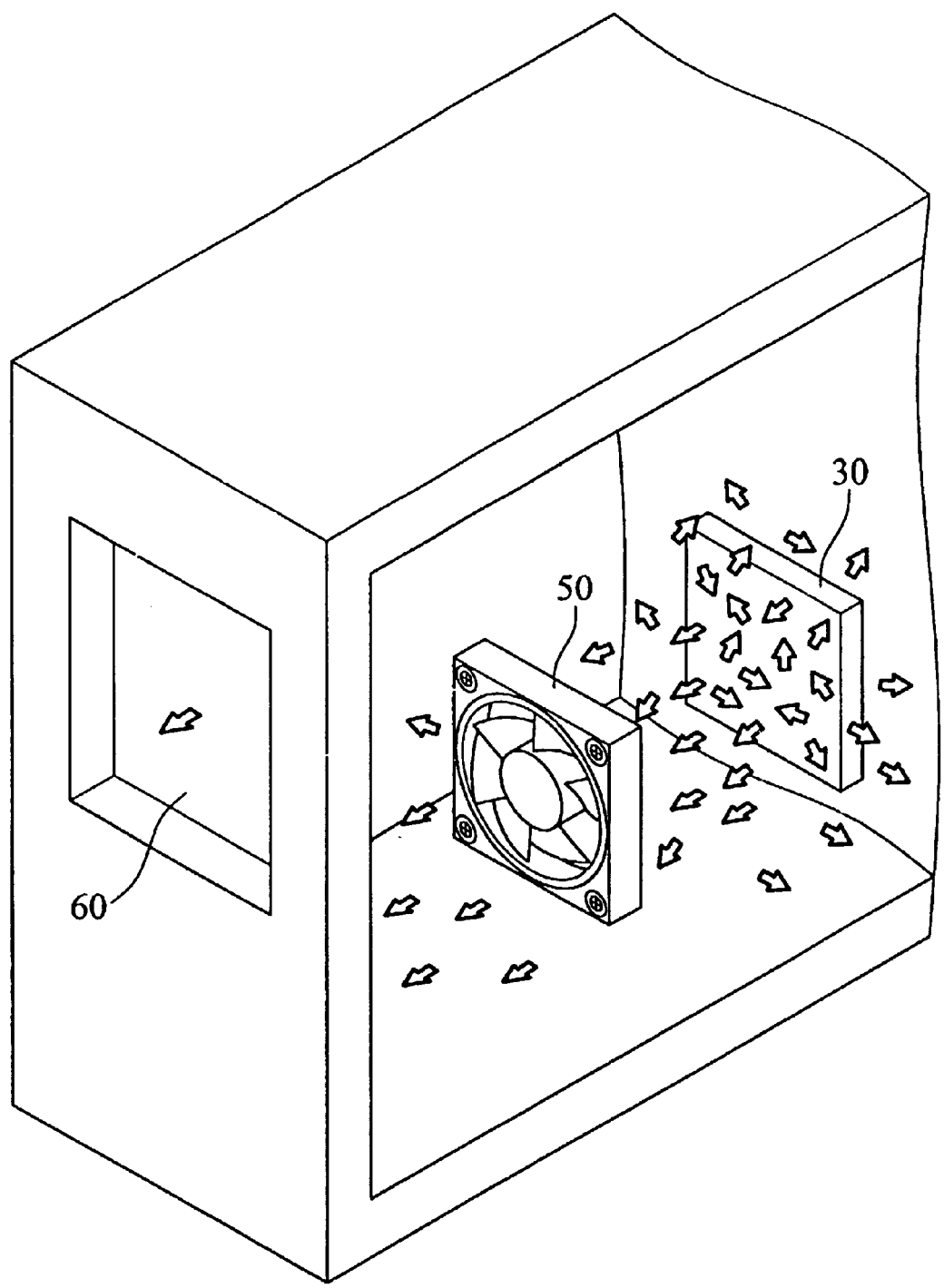
FIG. 4A is a schematic view showing the airflow simulation of the present heat dissipation apparatus using an unpowered fan.
Figure 4B:
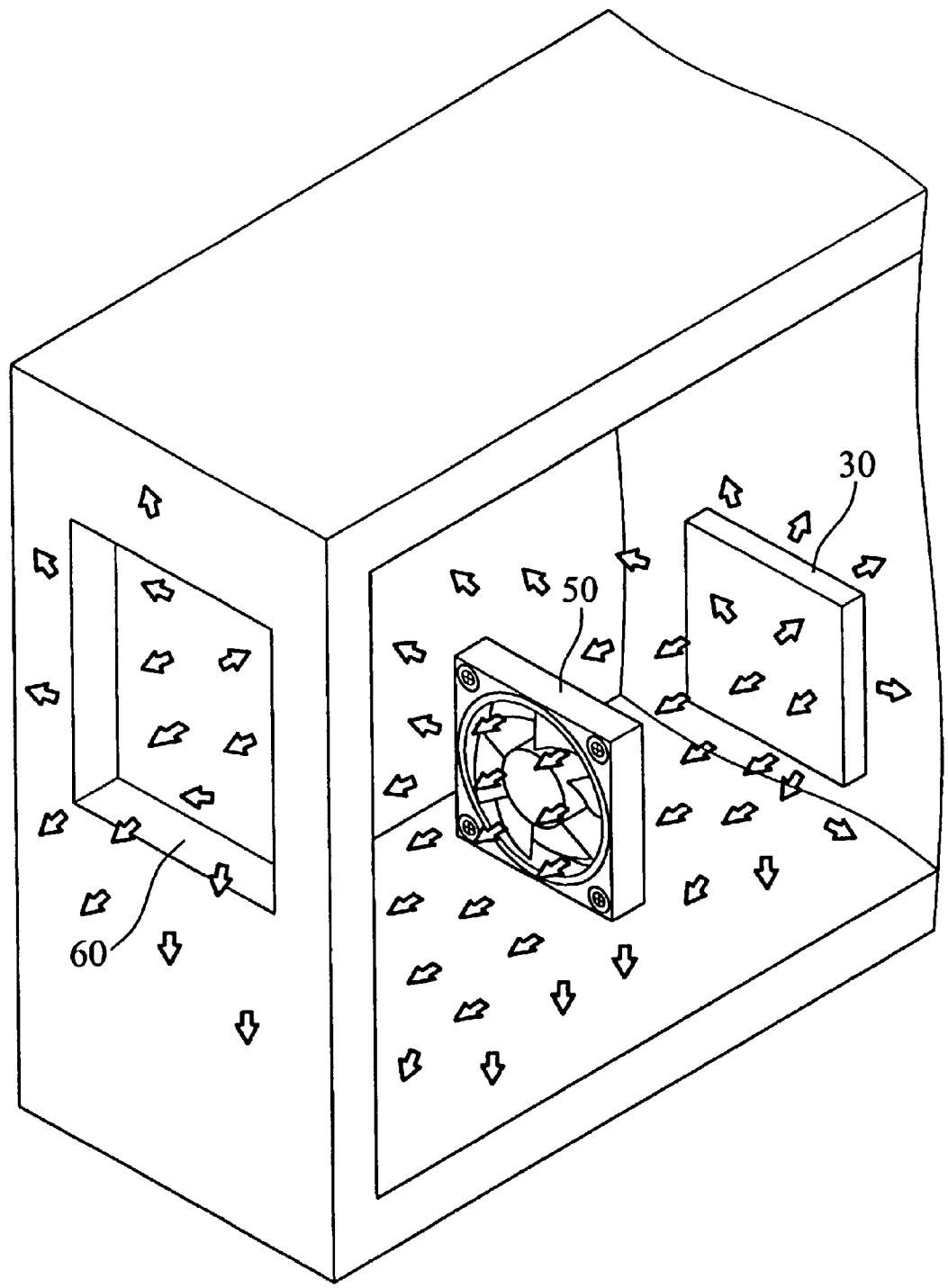
FIG. 4B is another schematic view showing the airflow simulation of the present heat dissipation apparatus using an unpowered fan.

Referring to FIG. 3, the heat dissipation apparatus for a computer system having a heat source comprises an outlet 60, a temperature gradient maintaining device (not shown) and an unpowered fan 50. In this embodiment, the heat source is a CPU 30. The unpowered fan 50 is disposed on a heat sink 40. The heat sink 40 is disposed on the CPU 30. As shown in FIG. 4A, when the unpowered fan 50 does not rotate, hot air surrounding the CPU 30 moves slowly (as shown by the arrows). Because the temperature at the CPU 30 is higher than that at the outlet 60, thermal convection is caused by the temperature difference therebetween. When the intensity of the thermal convection increases to a certain level, the unpowered fan 50 rotates and the air between the CPU 30 and the outlet 60 is stirred intensely, as shown in FIG. 4B. At this time, the heat is not accumulated on the CPU 30 and is taken away by rotation of the unpowered fan 50, as shown by the arrows in FIG. 4B. In addition, air surrounding the CPU 30 can be transmitted to the outlet 60 quickly and evenly by airflow stirring caused by rotation of the unpowered fan 50. Thus, the temperature of the CPU 30 is reduced. Furthermore, the temperature gradient maintaining device, such as a cooling device, is disposed near the outlet 60 to maintain the temperature difference between the CPU 30 and the outlet 60 and enhance heat dissipation.

Moreover, the blades of the unpowered fan 50 are lightweight material, such as plastic. In addition to the CPU 30, the heat source can also be a hard disk drive, an optical disk drive, a random-access memory or a power supply device.

Since the unpowered fan 50 does not have a lifespan limit like the conventional fan, the electronic components in the computer system are not easily damaged by high temperature. In addition, the temperature gradient maintaining device can be adjusted as required. If the quality of the temperature gradient maintaining device is good, the lifespan of the electronic components in the computer system is minimally affected thereby.

The present heat dissipation apparatus using the unpowered fan has many advantages as follows:

(1) Electric power required by the conventional fan is conserved.
(2) Electronic devices for disposing the conventional fan are not required.
(3) The assembly of the unpowered fan is simplified.
(4) The cost of the present heat dissipation apparatus is enormously reduced as compared to that of the conventional fan.

While the invention has been described by way of examples and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A heat dissipation apparatus for a computer system with a heat source, comprising:

an outlet disposed on one side of the computer system, wherein a thermal convection route is formed between the heat source and the outlet, a temperature gradient maintaining device for maintaining a temperature difference between the heat source and the outlet, and an unpowered fan with a plurality of blades disposed on the thermal convection route.

2. The heat dissipation apparatus as claimed in claim 1, wherein the unpowered fan is disposed beside the heat source.

3. The heat dissipation apparatus as claimed in claim 1, wherein the temperature gradient maintaining device is disposed on the outlet.

4. The heat dissipation apparatus as claimed in claim 1, wherein the unpowered fan rotates due to thermal convection between the heat source and the outlet caused by the temperature difference.

5. The heat dissipation apparatus as claimed in claim 1, wherein the temperature gradient maintaining device maintains the temperature difference between the heat source and the outlet at 30° C.~50° C. to keep the blades of the unpowered fan rotating continuously.

6. The heat dissipation apparatus as claimed in claim 1, wherein the heat source is a CPU.

7. The heat dissipation apparatus as claimed in claim 1, wherein the heat source is a hard disk drive.

8. The heat dissipation apparatus as claimed in claim 1, wherein the heat source is an optical disk drive.

9. The heat dissipation apparatus as claimed in claim 1, wherein the heat source is a random-access memory.

10. The heat dissipation apparatus as claimed in claim 1, wherein the heat source is a power supply device.

11. The heat dissipation apparatus as claimed in claim 1, wherein the blades of the unpowered fan are plastic.

12. The heat dissipation apparatus as claimed in claim 1, wherein the temperature gradient maintaining device is a cooling device.

\* \* \* \* \*